US007687401B2

(12) United States Patent
Feng et al.

(10) Patent No.: US 7,687,401 B2
(45) Date of Patent: Mar. 30, 2010

(54) SUBSTANTIALLY SPHERICAL COMPOSITE CERIA/TITANIA PARTICLES

(75) Inventors: Xiangdong Feng, Upland, CA (US);
Yie-Shein Her, Canandaigua, NY (US);
Anthony C. Sutorik, Milan, MI (US);
M. Sharon Paras, Howell, MI (US)

(73) Assignees: Ferro Corporation, Cleveland, OH (US); Nanocerox, Inc., Ann Arbor, MI (US)

( * ) Notice: Subject to any disclaimer, the term of this patent is extended or adjusted under 35 U.S.C. 154(b) by 807 days.

(21) Appl. No.: 11/380,980

(22) Filed: May 1, 2006

(65) Prior Publication Data
US 2007/0254484 A1 Nov. 1, 2007

(51) Int. Cl.
*H01L 21/302* (2006.01)
(52) U.S. Cl. .................... 438/693; 438/692; 51/309
(58) Field of Classification Search ............ 438/691, 438/692, 693; 501/18, 19; 51/309
See application file for complete search history.

(56) References Cited

U.S. PATENT DOCUMENTS

| 5,075,090 | A | * | 12/1991 | Lewis et al. ................ 423/337 |
| 5,418,298 | A | | 5/1995 | Laine et al. |
| 5,614,596 | A | | 3/1997 | Laine et al. |
| 5,674,985 | A | * | 10/1997 | Hawkins et al. ............ 534/16 |
| 5,958,361 | A | | 9/1999 | Laine et al. |
| 6,602,439 | B1 | | 8/2003 | Hampden-Smith et al. |
| 6,723,674 | B2 | * | 4/2004 | Wang et al. ................ 501/152 |
| 6,730,245 | B2 | | 5/2004 | Hampden-Smith et al. |
| 2004/0067839 | A1 | * | 4/2004 | Nawa et al. ................ 501/105 |
| 2004/0203241 | A1 | | 10/2004 | Hampden-Smith et al. |
| 2005/0081998 | A1 | | 4/2005 | Hampden-Smith et al. |
| 2006/0070551 | A1 | * | 4/2006 | Kanamori et al. ......... 106/287.17 |

FOREIGN PATENT DOCUMENTS

WO WO03070640 A1 8/2003

OTHER PUBLICATIONS

DuPont Tyzor Organic Titanates, General Brochure, Copyright 2001, 11 pages.

* cited by examiner

*Primary Examiner*—Lan Vinh
(74) *Attorney, Agent, or Firm*—Rankin, Hill & Clark LLP (57) ABSTRACT

The present invention provides substantially spherical composite ceria/titania particles, a method of forming the same, and chemical mechanical polishing compositions comprising such particles. The substantially spherical particles include a substantially crystalline core portion including one or more crystallites having a cubic lattice structure including $Ce_{(1-x)}Ti_{(x)}O_2$, where x is <0.25, and a substantially amorphous cladding covering at least a portion of the substantially crystalline core portion, the substantially amorphous cladding including $Ti_{(1-y)}Ce_{(y)}O_2$, where y is $\leq 0.50$. The method of forming the particles includes combusting an organic solvent including a cerium salt of a carboxylic acid and a titanium (IV) chelate in a combustion supporting gas and collecting agglomerates comprising two or more substantially spherical particles. The agglomerates can be used as an abrasive material in chemical mechanical polishing compositions to remove film layers during the fabrication of integrated circuit devices.

13 Claims, 11 Drawing Sheets

SUBSTANTIALLY SPHERICAL COMPOSITE CERIA/TITANIA PARTICLES

FIELD OF THE INVENTION

The present invention relates to composite ceria/titania particles and, more particularly, to substantially spherical composite ceria/titania particles, a method of forming the same via flame spray pyrolysis and use of the same in chemical-mechanical polishing applications.

BACKGROUND OF THE INVENTION

Ceria ($CeO_2$) is an increasingly important inorganic oxide that is used as an abrasive material in chemical mechanical polishing compositions for planarizing surfaces during the fabrication of integrated circuits. When produced via conventional flame spray pyrolysis processes, ceria tends to exhibit a substantially cubic, crystalline shape. It is believed that the relatively sharp edges of the cubic shaped ceria particles may gouge and/or scratch surfaces being planarized, which is particularly problematic as the size of integrated circuit architecture decreases.

SUMMARY OF THE INVENTION

The present invention provides substantially spherical composite ceria/titania particles, a method of forming the same, and chemical mechanical polishing compositions comprised of such particles. The substantially spherical composite ceria/titania particles comprise a substantially crystalline core portion comprising $Ce_{(1-x)}Ti_{(x)}O_2$, where x is <0.25, and a substantially amorphous cladding covering at least a portion of the substantially crystalline core portion, the substantially amorphous cladding comprising $Ti_{(1-y)}Ce_{(y)}O_2$, where y is ≦0.50. The method of forming substantially spherical ceria/titania composite particles according to the invention comprises combusting a mixture comprising a cerium compound and a titanium (IV) chelate dissolved in an organic solvent in a combustion supporting gas in the presence of oxygen, and collecting the substantially spherical composite ceria/titania particles in the form of agglomerates.

Agglomerates of the substantially spherical ceria/titania particles according to the invention can be used as an abrasive material in chemical mechanical polishing compositions to remove film layers such as silicon dioxide, for example, during the fabrication of integrated circuit devices. When used in identical polishing conditions, the agglomerates of spherical ceria/titania particles according to the invention remove silicon dioxide at a greater rate and produce a smoother surface than ceria particles of similar size produced via conventional flame spray pyrolysis.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

BRIEF DESCRIPTION OF THE DRAWINGS

Composite

DETAILED DESCRIPTION OF THE INVENTION

Sutorik et al., WO 03/070640, which is hereby incorporated by reference in its entirety, discloses a process for the preparation of certain mixed-metal oxide particles by liquid feed flame spray pyrolysis of mixtures of metal oxide precursors in oxygenated solvents. Substantially spherical composite ceria/titania particles are not disclosed in that prior art reference, but such particles and methods of forming the same are disclosed in the present application.

In accordance with the present invention, the precursors for substantially spherical composite ceria/titania particles comprise: (1) a first precursor comprising an organic solvent soluble cerium compound such as a salt of a carboxylic acid (i.e., a cerium carboxylate) or a cerium alkoxide; and (2) a second precursor comprising a titanium (IV) chelate. Both the first and second precursors are present in an organic solvent, which is preferably a volatile, low viscosity solvent such as, for example, methanol. The first and second precursors and the organic solvent form an atomizable liquid feed that is substantially free of solid material. Combustion of the liquid feed produces particles that are substantially spherical in shape and comprise a substantially crystalline core portion comprising $Ce_{(1-x)}Ti_{(x)}O_2$, where x is <0.25, and a substantially amorphous cladding covering at least a portion of the substantially crystalline core portion, the substantially amorphous cladding comprising $Ti_{(1-y)}Ce_{(y)}O_2$, where y is ≦0.50. Individual substantially spherical particles are sometimes referred to herein as "primary" particles, whereas agglomerates of two or more primary particles are sometimes referred to herein as "secondary" particles.

In the substantially crystalline core portion, titanium ions ($Ti^{+4}$) are substituted for cerium ions ($Ce^{+4}$) in the lattice structure of the crystal, thus preserving the ratio of metal cations to oxygen ions in such crystal and the predominant cerium oxide lattice structure of the crystal. Thus, the mole ratio of metal ions ($Ce^{+4}+Ti^{+4}$) to oxygen ions in the lattice structure of the crystalline core portion is generally 1:2, although slight mathematical variation in the mole ratios of metal ions to oxygen ions is possible. The ratio of metal ions ($Ce^{+4}+Ti^{+4}$) to oxygen ions in the crystalline core portion is sufficient to preserve overall statistical electroneutrality. The difference in the electronegativity and size of the titanium ions versus the cerium ions is believed to catalyze redox reactions on the surface of the crystal and cause lattice strain energy, which can further enhance the polishing effectiveness of the particles in chemical-mechanical polishing ("CMP") applications.

As noted above, the substantially crystalline core portion is covered, at least in part, by a substantially amorphous cladding comprising $Ti_{(1-y)}Ce_{(y)}O_2$, where y is ≦0.50. The cladding is substantially non-crystalline, and thus there is no crystalline matrix or lattice structure for substitution of the metal ions ($Ce^{+4}+Ti^{+4}$). The cladding is predominantly amorphous $TiO_2$, but some (less than or equal to 50 mole percent, and most typically less than 20 mole percent) amorphous $CeO_2$ can also be present, separately or mixed within the amorphous $TiO_2$. The cladding is believed to help the particles attain their substantially spherical shape.

Particularly useful organic solvent soluble cerium compounds include cerium carboxylates having from about 2 to about 5 carbon atoms. Cerium propionate is particularly preferred for use in the invention. The cerium compound serves as precursor material for the formation of ceria (cerium dioxide) having a substantially cubic crystalline lattice structure. Most of the primary particles formed by the process are single crystalline, meaning that the crystalline core comprises a single crystal as opposed to an agglomeration of individual crystallites.

The titanium (IV) chelate must be soluble in the organic solvent and compatible with the cerium compound. The preferred titanium (IV) chelate is titanium (IV) triethanolaminato isopropoxide, which is available from DuPont under the TYZOR TE trade designation. Titanium acetyl acetone complexes can also be used. The titanium (IV) chelate serves as a titanium dopant in the sense that a few titanium atoms become substituted for cerium atoms in the crystal lattice core structure of the resulting particles. The titanium (IV) chelate also serves as an amorphous titanium dioxide precursor, with the amorphous titanium dioxide being disposed on the core structure as a cladding, which may or may not cover the core structure entirely. Small amounts of amorphous ceria may also be present and dispersed in the amorphous titania cladding structure.

The organic solvent used in the process is preferably a linear or branched alcohol comprising from 1 to 12 carbon atoms, or a linear or branched chain ester comprising from 2 to 16 carbon atoms. Suitable alcohols include, for example, methanol and ethanol. Suitable esters include ethyl lactate, ethyl propionate, methyl lactate, n-propyl lactate, butyl lactate and 2-ethyl hexyl lactate. Polyalcohols such as ethylene glycol can also be used. Preferably, the organic solvent used in the invention contains at least one oxygen atom. More preferably, no solvents are present in the liquid feed that do not contain an oxygen atom.

The first and second precursors should generally be present in the organic solvent in amounts between 0.1 weight percent to about 25 weight percent. At the lower end of the concentration range, ceramic yield relative to total solution weight will be low. The solubility of the precursors in the organic solvent defines the upper end of the concentration range. Consideration must also be given to the viscosity of the resulting solution, which must be atomizable. Solutions of lower concentration tend to form composite ceria/titania particles of smaller primary particle size, which is typically referred to herein by average mean diameter ($D_{mean}$).

Combustion is effected by atomizing the liquid feed into a stream of oxygen-containing combustion supporting gas, such as air, and igniting the mixture in a closed chamber. The term "closed" as it is used in this sense means that the combustion zone is not directly open to the surroundings. The combustion supporting gas is preferably oxygen, which may be supplemented with a separate flow of pure oxygen or dry air. The use of oxygen-enriched air is not problematic. In some instances, hydrogen gas may be added as a fuel to control the flame temperature.

The combustible mixture may be ignited by any convenient method, for example spark discharge, glow plug, pilot flame, etc. It is preferred that a pilot flame, i.e. of $H_2/O_2$ or methane/$O_2$ be used. As a result of the combustion, temperatures approaching 2500° C. are generally produced. Preferably, the peak combustion temperature is above the melting temperature of $TiO_2$ (i.e., greater than about 1800° C.), but less than the melting point of $CeO_2$ (i.e., less than about 2600° C.). At such temperatures, the first precursor results in the formation of $CeO_2$, which crystallizes into single crystals at the core of the primary particles. Without being bound to a particular theory, applicants believe that some of the titanium atoms become substituted for cerium atoms in the crystal lattice structure, creating lattice strain energy. The majority of the titanium dioxide by-product from the combustion of the second precursor is in a molten state. Rapid cooling of the particles as they leave the combustion chamber does not give the titanium dioxide sufficient time to crystallize, and thus a thin, several molecular layers thick cladding of amorphous titanium dioxide forms on some or all of the surfaces of the doped cerium oxide crystalline core structure, enhancing the formation of a substantially spherical primary particle morphology.

Following combustion, the substantially spherical ceria/titania particles may be collected by conventional methods, including bag filtration, electrostatic precipitation, etc. Flow of particles may be assisted by the introduction of filtered air or other gas downstream from the combustion zone where the constituents of the added gas will not react with the particles. The collected particles tend to be agglomerates of two or more primary particles.

Atomization of the liquid feed can be accomplished by any suitable technique, including Bernoulli misters, cross-flow atomizers, fog misters, high-pressure spray nozzles, ultrasonic misters etc. So-called two-fluid atomizers are preferred. Such atomizers are readily available.

Figure 1:
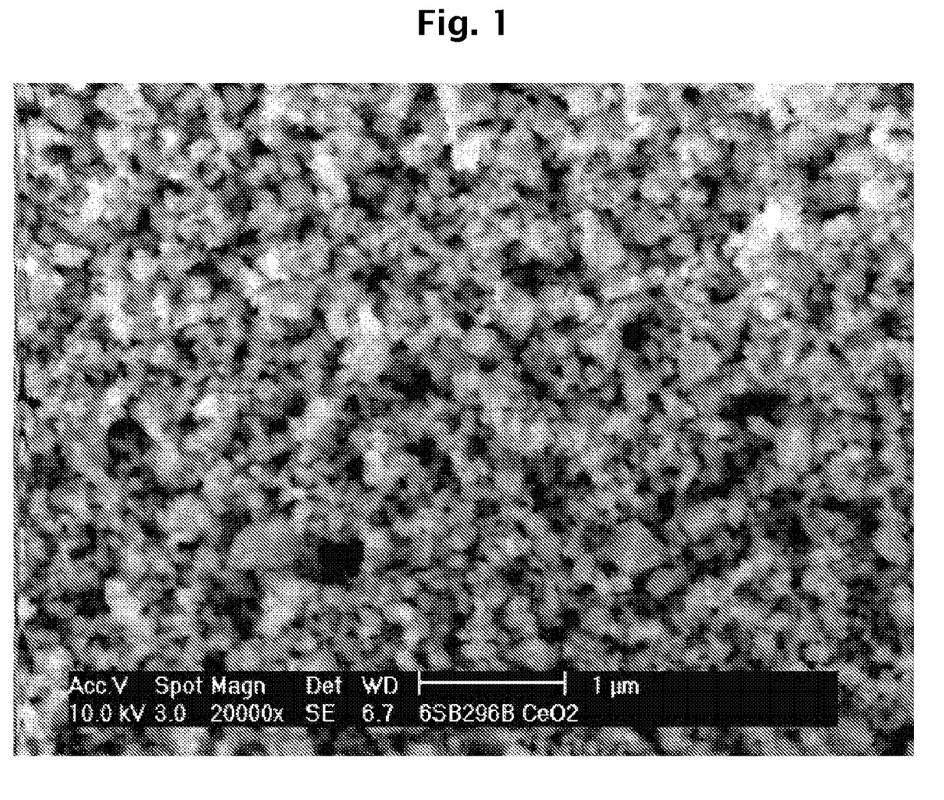
FIGS. 1, 2, 3 and 4 are scanning electron micrographs of particles formed in Example 3 from Precursor Solutions A, B, C and D, respectively, taken at 20,000× magnification.
Figure 2:
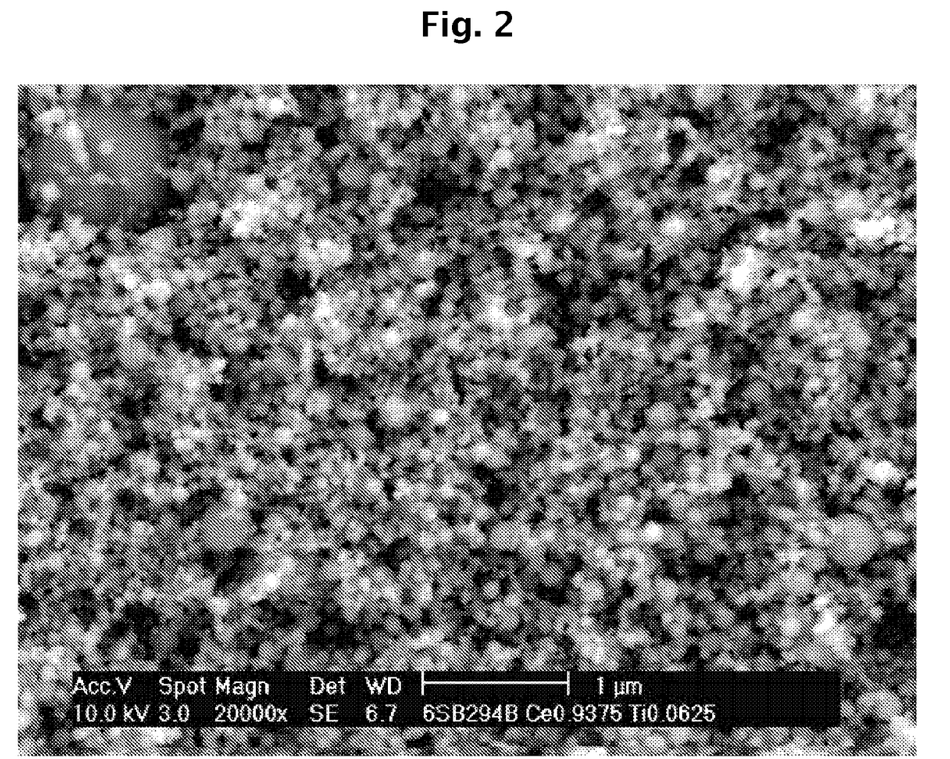
Figure 3:
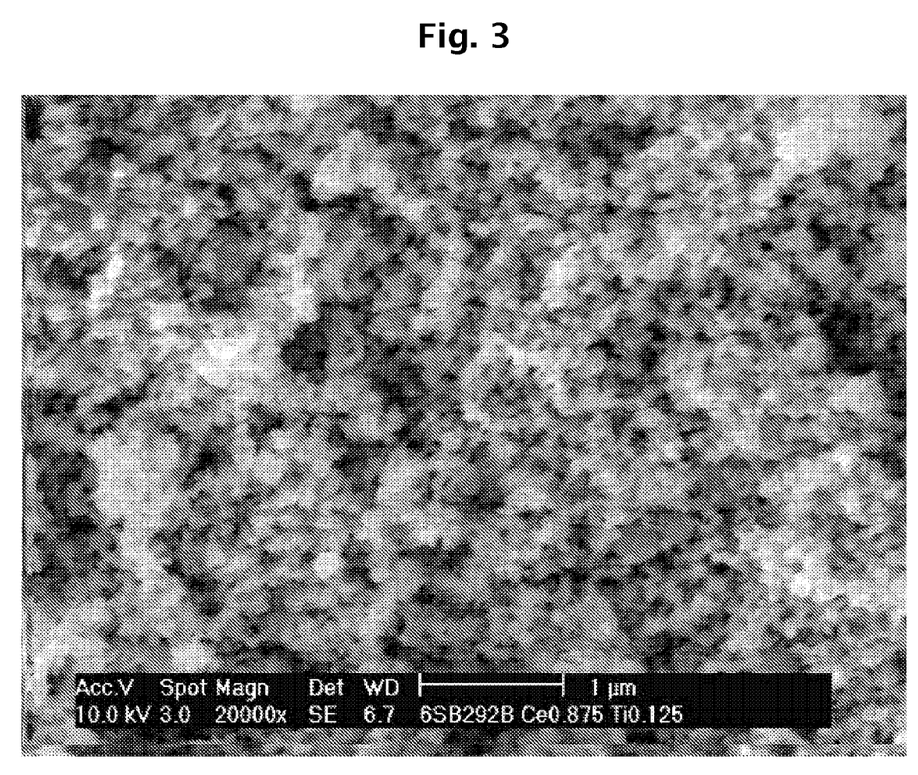
Figure 4:
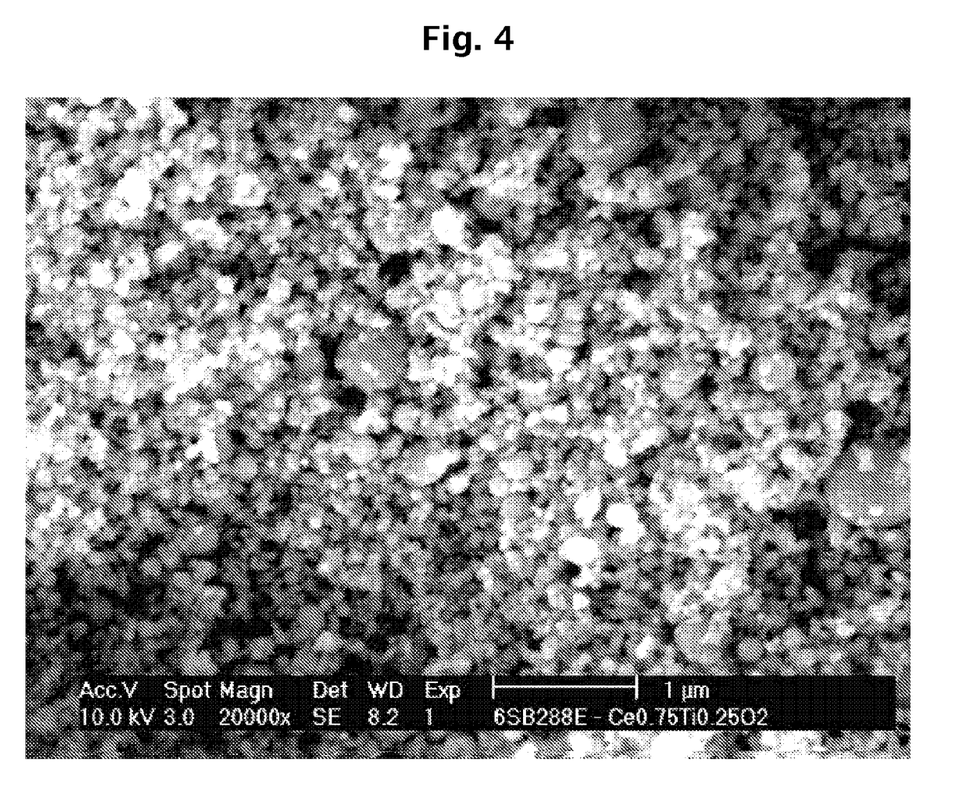

The liquid feed flame spray device may be constructed in any suitable manner, mindful of the operating pressures involved. Reference may be had to U.S. Pat. No. 5,958,367, FIGS. 3-5, for example, which shows a spray head feeding a liquid feed to a quartz combustion chamber. The combustion chamber section is reduced and terminates in a quartz tube. A graded quartz/PYREX tube may be used to connect the high temperature front end to the lower temperature collection unit, in this case, an electrostatic precipitation unit with central wire electrodes and a foil or plated liner. An exit from the device may be treated to scrub gases and fine particles not collected by the precipitation unit, or may be attached to bag filters, etc. Ignition torches are located in the combustion chamber to ignite the liquid feed.

The substantially spherical composite ceria/titania primary particles produced in accordance with the invention tend to be very small in size, typically having a $D_{mean}$ of from about 20 nm to about 1.0 µm. In most instances, the particles tend to be ultrafine (i.e., $D_{mean}=\sim100\text{-}500$ nm) or nanosize (i.e., $D_{mean}=\sim20\text{-}100$ nm). The core structures are typically single crystalline, but some crystallite particle agglomeration may occur. The outer surface of the crystalline core is at least partially, and often completely, covered by a layer of amorphous titania, which may include small amounts of amorphous ceria. The substantially spherical composite ceria/titania primary particles produced in accordance with the invention tend to agglomerate together to form secondary particles that are useful for polishing. The $D_{mean}$ of the secondary particles tends to be from about two to about six times, or about four times, the $D_{mean}$ of the primary particles. The $D_{max}$ of the secondary particles tends to be from about five to about fifteen times, or about ten times, the $D_{max}$ of the primary particles.

The agglomerates of substantially spherical composite ceria/titania particles produced in accordance with the invention are particularly useful as abrasive particles in chemical mechanical polishing slurries used to fabricate integrated circuit devices. In such applications, the agglomerates are dispersed in a liquid medium such as, for example, deionized water. Chemical agents may also be present including, for example, proline. It will be appreciated that the composition of the chemical mechanical polishing slurry will be dependent upon the surface to be planarized.

Thus, the present invention also provides a method of planarizing a film surface during the fabrication of an integrated circuit device. In accordance with the method of the invention, a chemical mechanical polishing slurry comprising the agglomerates of the substantially spherical composite ceria/titania particles is disposed between a film surface and a polishing pad, and the polishing pad is moved relative to the film surface until a desired amount of the film surface has been removed. In chemical mechanical polishing applications, the average primary particle diameter of the substantially spherical composite ceria/titania particles is preferably from about 20 nm to about 1 µm, and more preferably from about 50 nm to about 200 nm Chemical mechanical polishing slurries comprising agglomerates of the substantially spherical composite ceria/titania particles according to the invention can be used to remove a variety of film layers including, but not limited to, silicon dioxide. Integrated circuits having surfaces polished (i.e., planarized) using the slurry composition and method of the invention exhibit substantially smoother surfaces (i.e., less surface roughness) than is achievable using conventional abrasives, which tend to be crystalline in nature.

The following examples are intended only to illustrate the invention and should not be construed as imposing limitations upon the claims.

EXAMPLE 1

3100 grams of propionic acid was heated in a 12-liter round bottom flask until reflux conditions were obtained. 740 grams of cerium carbonate was then added to the reflux. The solution appeared turbid due to the presence of minor amounts of insoluble cerium sources and impurities in the cerium carbonate. The solution was refluxed at the boiling temperature of the solvent for about 120 minutes, and then allowed to cool to room temperature (~22.5° C.). 620 grams of deionized water was added, and the solution was then filtered through a 0.2 µm filter to obtain a clear solution. The final ceramic yield of the solution (as wt % ceria) was determined by gravimetric weight loss on heating samples to 1150° C. for 30 min. Typical stock solution concentrations were ~10 wt % $CeO_2$.

EXAMPLE 2

Four precursor solutions (A, B, C and D) were prepared by adding an amount of titanium (IV) triethanolaminato isopropoxide (DuPont TYZOR TE) to the cerium propionate stock formed in Example 1 sufficient to provide the cerium/titanium atom percentages shown in Table 1 below:

TABLE 1

| Precursor Solution | Ce (atom %) | Ti (atom %) |
| --- | --- | --- |
| A | 100 | 0 |
| B | 93.75 | 6.25 |
| C | 87.5 | 12.5 |
| D | 75 | 25 |

Final concentrations were adjusted between 7.5 and 2.5 wt % ceramic yield by dilution with a solution of deionized water and methanol in a 1:5.2 weight ratio.

EXAMPLE 3

Figure 5:
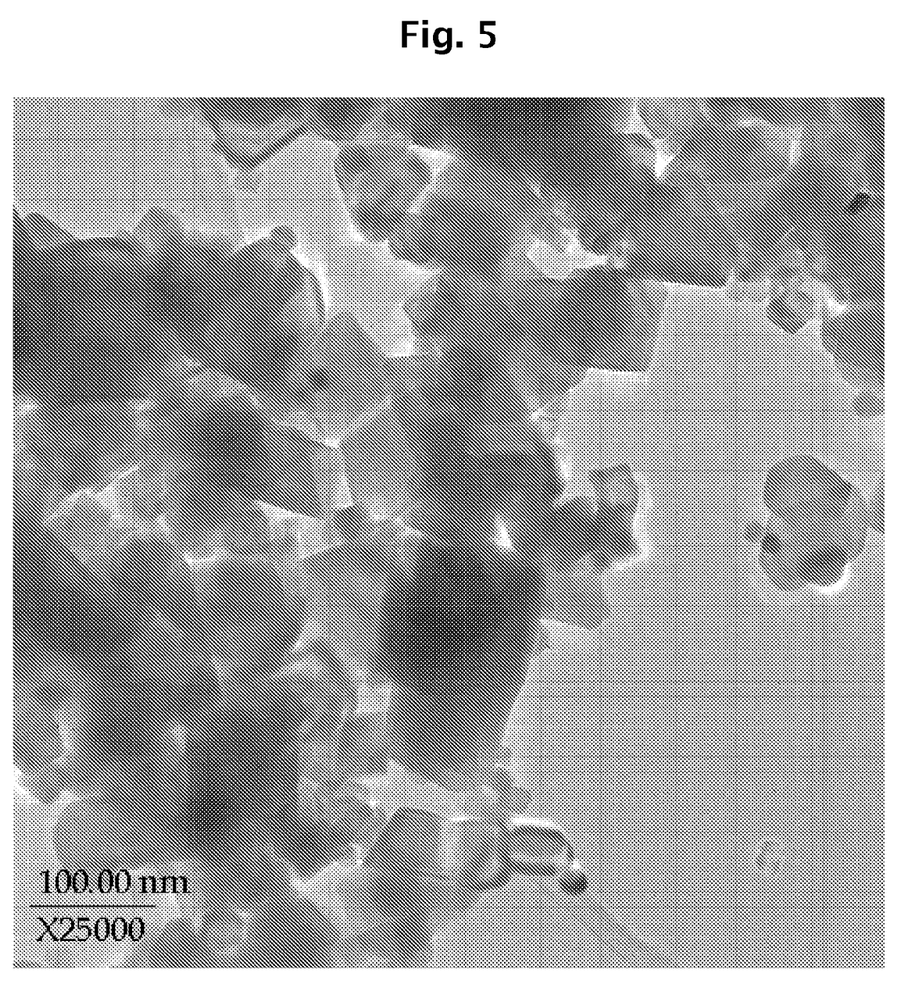
FIGS. 5 and 6 are transmission electron micrographs of the particles formed in Example 3 from Precursor Solution A at 25,000× and 300,000× magnification, respectively.
Figure 6:
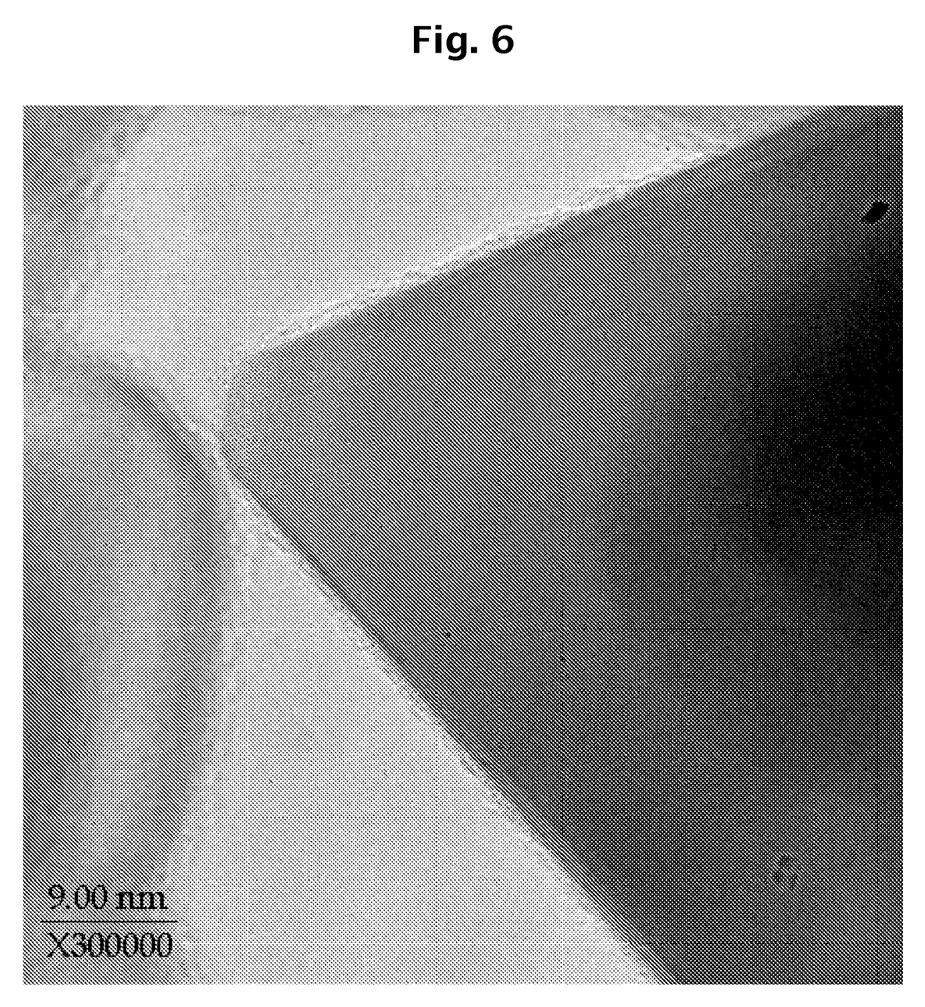
Figure 7:
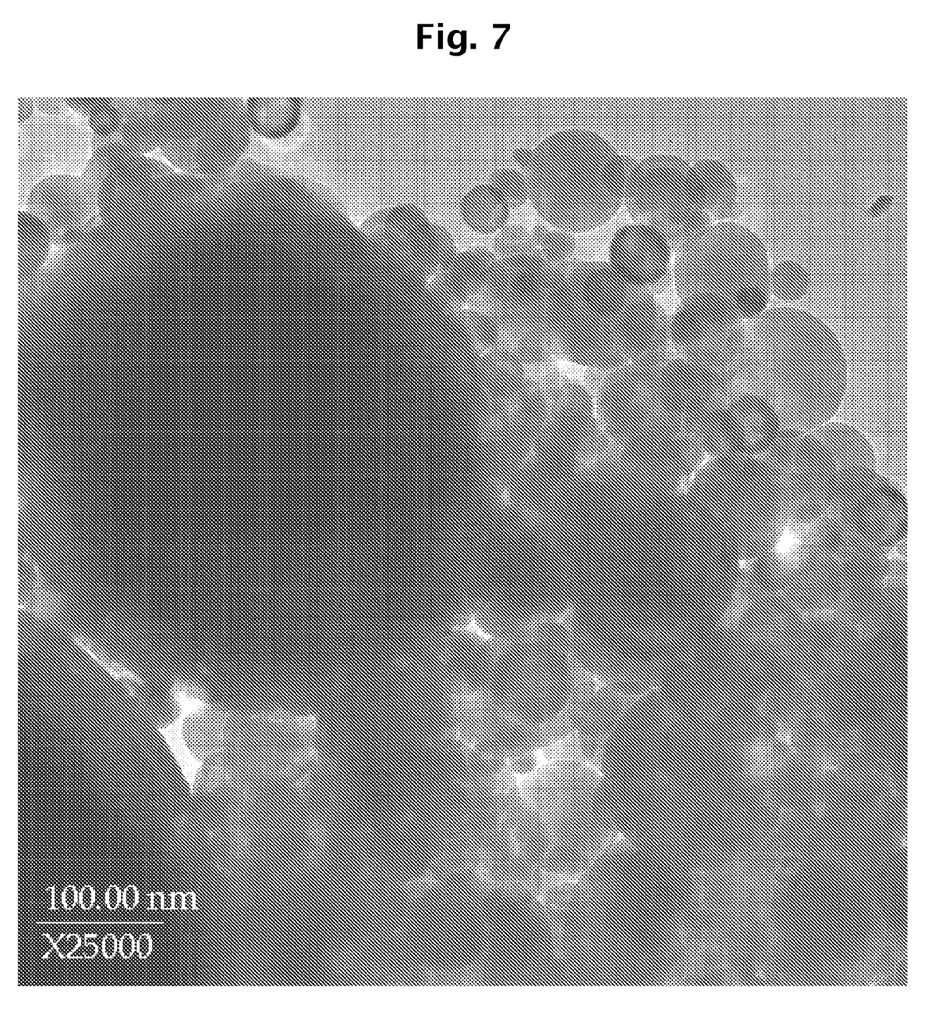
FIGS. 7 and 8 are transmission electron micrographs of the particles formed in Example 3 from Precursor Solution C at 25,000× and 300,000× magnification, respectively.
Figure 8:
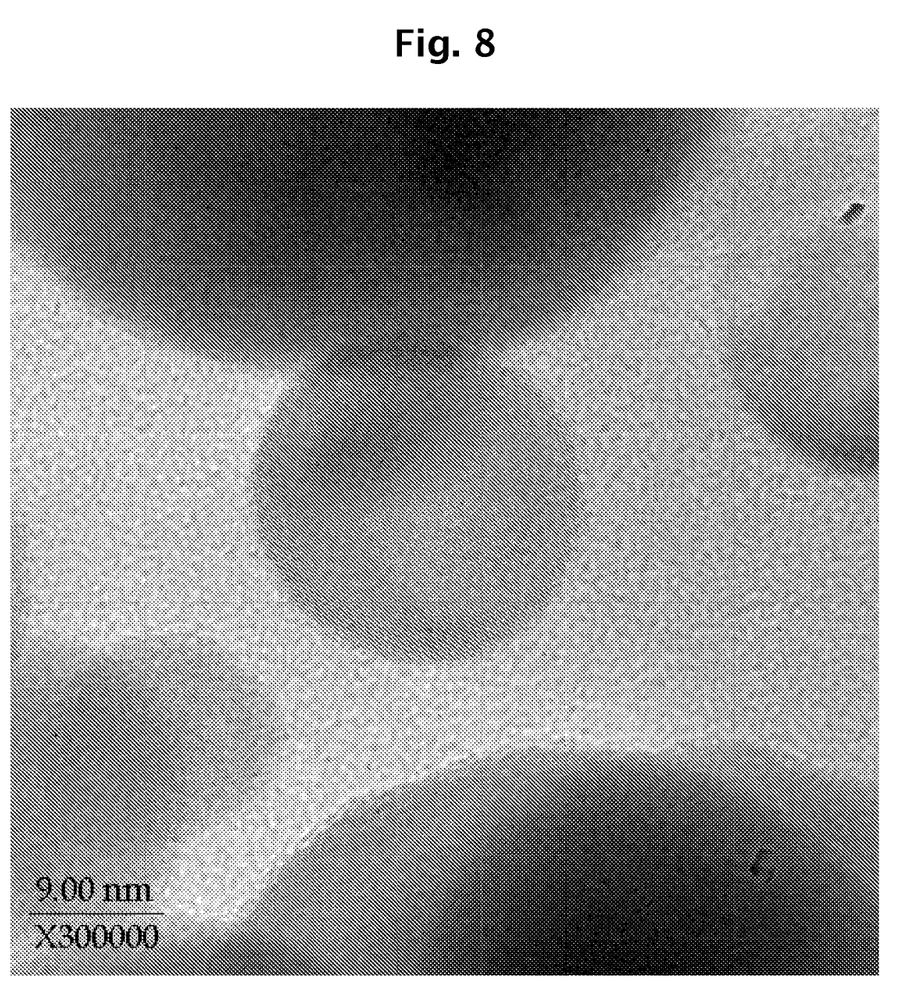
Figure 9:
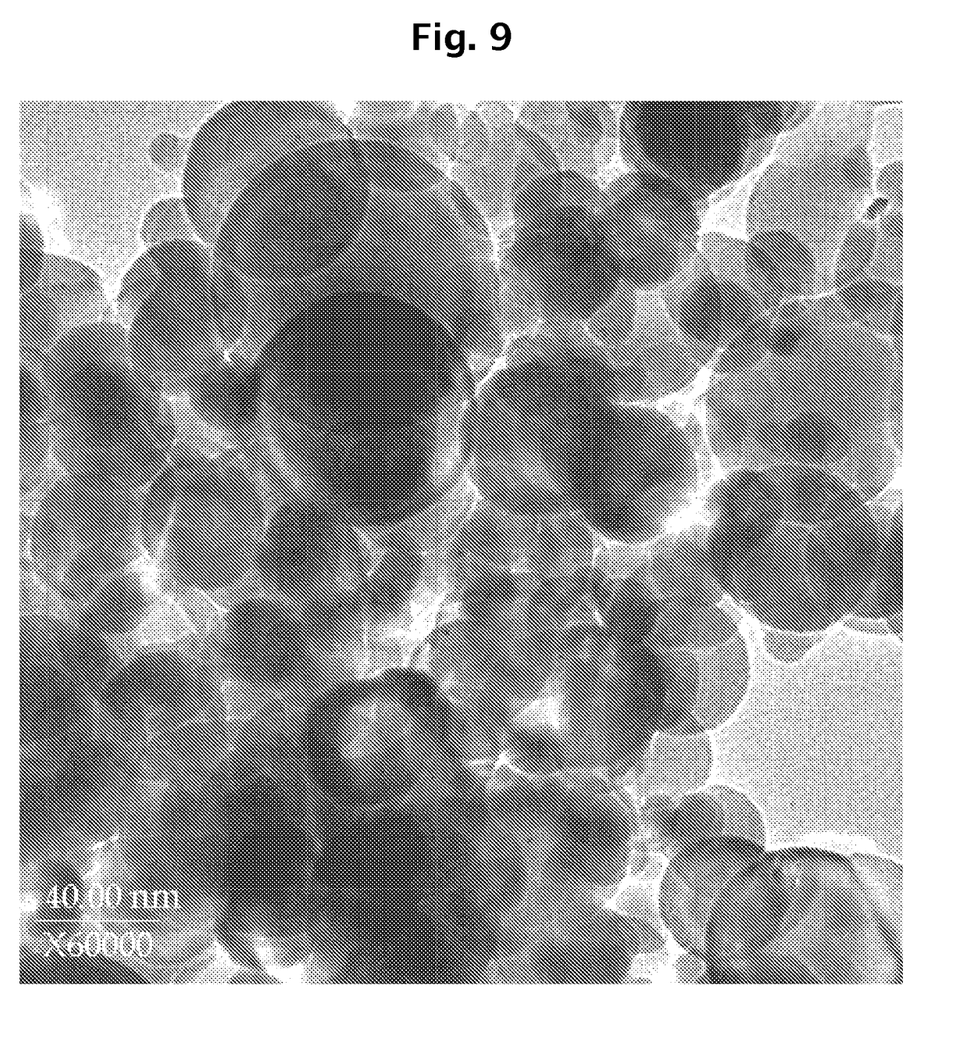
FIGS. 9 and 10 are transmission electron micrographs of the particles formed in Example 3 from Precursor Solution D at 60,000× and 300,000× magnification, respectively.
Figure 10:
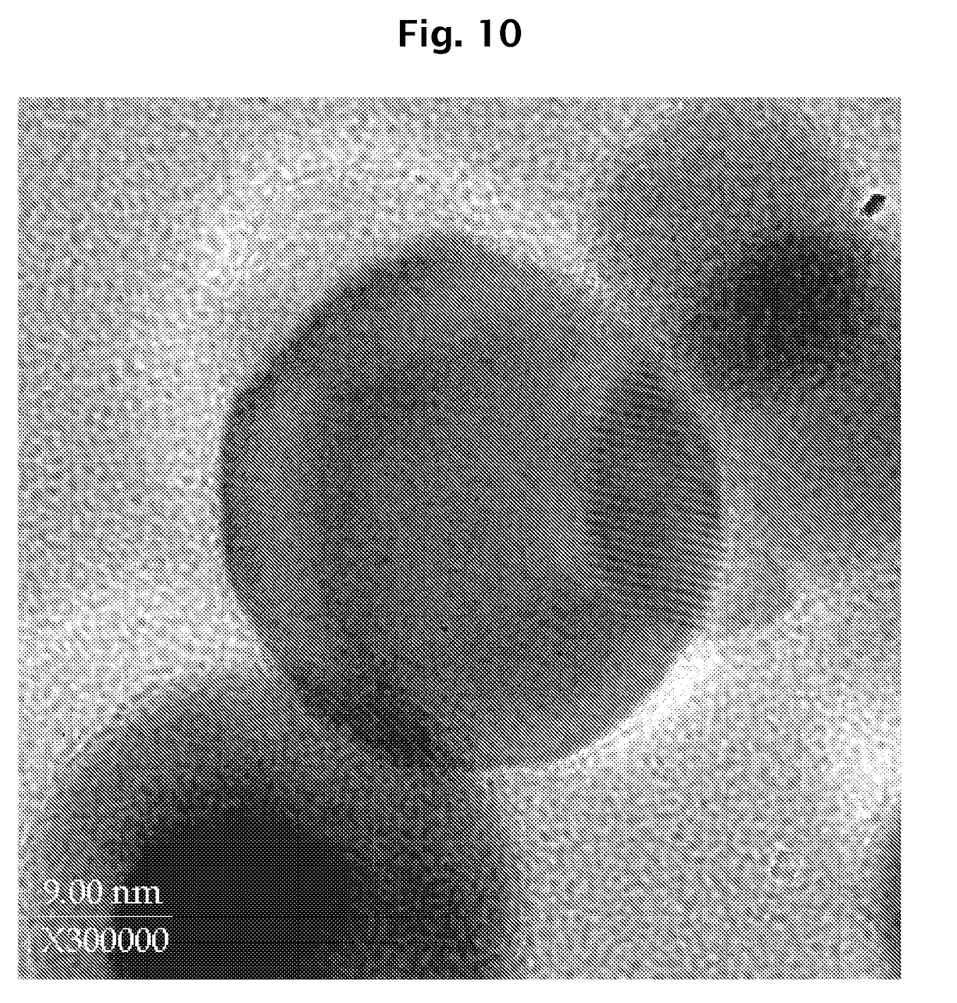

Precursor Solutions A, B, C and D from Example 2 were separately pumped at 120 grams per minute with a precursor concentration at 5% by weight. The atomizing oxygen ("AO") flow was at 2.0 cubic feet per minute ("CFM"), and the supplemental oxygen ("SO") flow at 4.1 CFM using methanol as the solvent in a pilot scale reactor that can produce kilogram quantities of powders. FIGS. 1, 2, 3 and 4 are scanning electron micrographs of particles formed from Precursor Solutions A, B, C and D, respectively, taken at 20,000× magnification. FIGS. 5 and 6 are transmission electron micrographs of the particles formed from Precursor Solution A at 25,000× and 300,000× magnification, respectively. FIGS. 7 and 8 are transmission electron micrographs of the particles formed from Precursor Solution C at 25,000× and 300,000× magnification, respectively. And, FIGS. 9 and 10 are transmission electron micrographs of the particles formed from Precursor Solution D at 60,000× and 300,000× magnification, respectively.

The transmission electron micrographs show that particles formed from Precursor Solutions B, C, and D, which contained titanium (IV) triethanolaminato isopropoxide, were substantially spherical in shape whereas the particles formed from Precursor Solution A, which did not contain any titanium (IV) triethanolaminato isopropoxide, were faceted.

EXAMPLE 4

The particles produced in Example 3 from Precursor solutions A, B, C and D were separately mixed with the components in the amounts shown in Table 2 to form CMP Slurries 4-A, 4-B, 4-C and 4-D, respectively. After mixing, the CMP Slurries were sonicated for 10 minutes. All of the slurries had a pH of 4.0 (adjusted with $HNO_3$).

TABLE 3

|  | CMP Slurry 4-A | CMP Slurry 4-B | CMP Slurry 4-C | CMP Slurry 4-D |
| --- | --- | --- | --- | --- |
| Particles A | 1.0 wt % | — | — | — |
| Particles B | — | 1.0 wt % | — | — |
| Particles C | — | — | 1.0 wt % | — |
| Particles D | — | — | — | 1.0 wt % |
| Proline | 1.0 wt % | 1.0 wt % | 1.0 wt % | 1.0 wt % |
| Water Soluble Nonionic Block Copolymer | 0.1 wt % | 0.1 wt % | 0.1 wt % | 0.1 wt % |
| Biocide | 0.05 wt % | 0.05 wt % | 0.05 wt % | 0.05 wt % |
| Water | balance | balance | balance | balance |

EXAMPLE 5

CMP Slurry Compositions 4-A through 4-D were separately used to polish $SiO_2$ and $Si_3N_4$ film layers on silicon wafers. The $SiO_2$ film layer was a 10,000 Å thermal oxide film on a silicon wafer. The $Si_3N_4$ film layer was 1,500 Å film formed by low-pressure chemical vapor deposition on a 1,000 Å $SiO_2$ thermal oxide film on a silicon wafer. In each case, the wafers were polished using a Strasbaugh 6EC polisher, with a Rodel IC-1000/SubaIV k-groove polishing pad at 4.5 psi down force and 1 psi back pressure, 135 rpm platen speed and 131 rpm head speed, 60% in-situ conditioning at 6 pounds down force with a Marshall Labs 80 grit diamond conditioner, and a slurry flow rate of 150 ml/min. Polishing results are reported in Table 3 below:

TABLE 3

|  | CMP Slurry 4-A | CMP Slurry 4-B | CMP Slurry 4-C | CMP Slurry 4-D |
|---|---|---|---|---|
| $SiO_2$ Removal Rate | 1950 Å/min | 2242 Å/min | 3005 Å/min | 2954 Å/min |
| $Si_3N_4$ Removal Rate | 12.6 Å/min | >1500 Å/min | >1500 Å/min | >1500 Å/min |

The results shown in Example 5 show that a slurry comprising 1% by weight of substantially spherical composite 87.5% ceria/12.5% titania particles (CMP Slurry 4-C) removed thermal oxide at a greater rate than a slurry comprising 1% by weight of conventional ceria particles (CMP Slurry 4-A).

EXAMPLE 6

Figure 11:
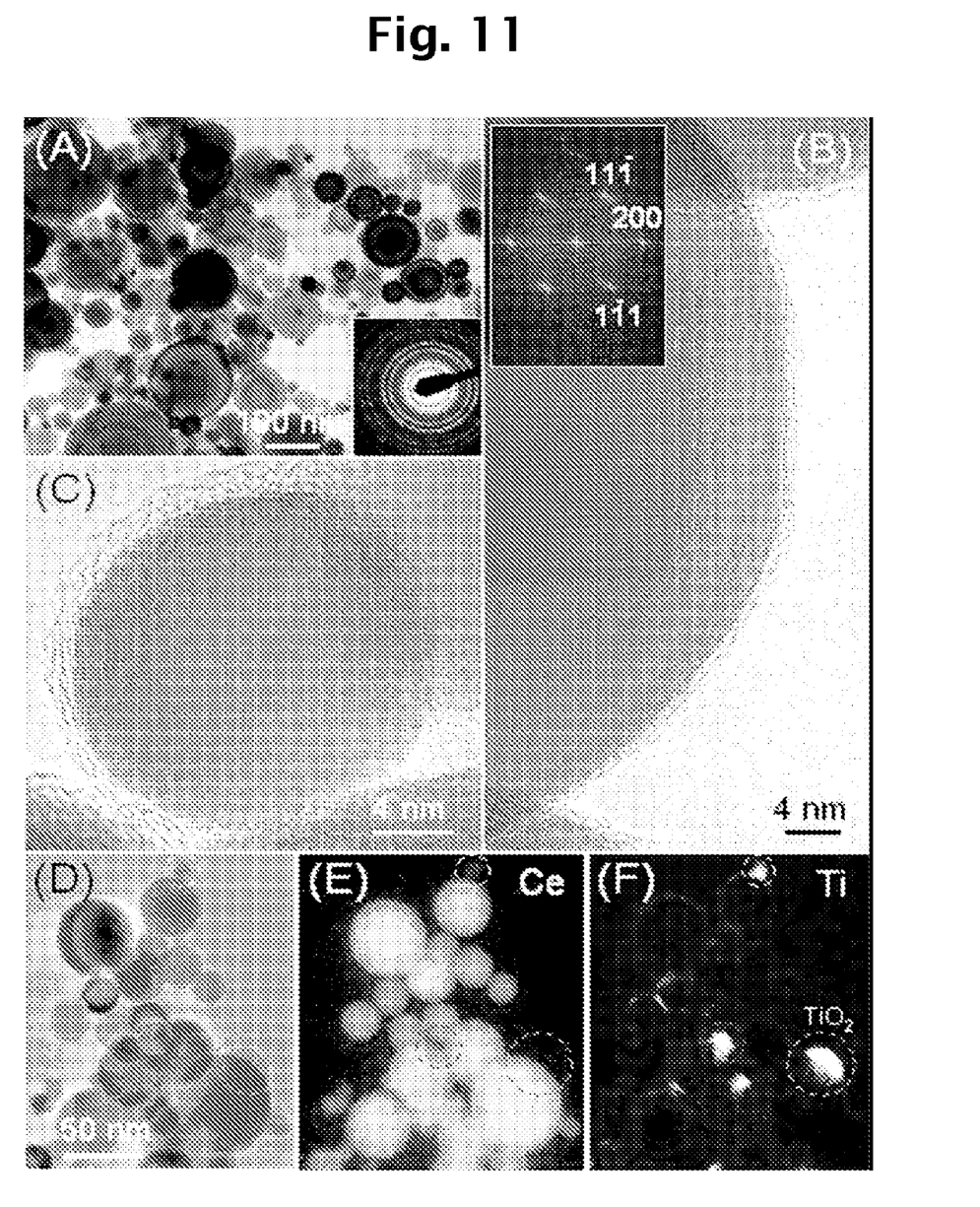
FIG. 11 shows transmission electron micrographs of the particles formed in Example 3 from Precursor Solution C.

Particles produced in Example 3 from Precursor solution C (87.5% ceria/12.5% titania) were examined using transmission electron microscopy (TEM). Composite FIG. 11A shows that such particles do not have a uniform size distribution, but tend to exhibit a substantially spherical shape. The smaller box in Composite FIG. 11A shows the tip of an x-ray probe pointing to a single particle. The concentric rings radiating therefrom indicate that the particles are single-crystal in nature.

Composite FIG. 11B is a high resolution TEM of a portion of a relatively large substantially spherical particle. The portion of the particle shown in Composite FIG. 11B appears to have a 1-2 nm layer on its surface that is different in composition from the core of the particle. The smaller box in Composite FIG. 11B shows the x-ray diffraction pattern for the particle, indicating again that it is a single crystal.

Composite FIG. 11 C shows a smaller particle than shown in Composite FIG. 11 B at the same resolution. The same core-shell structure appears on the smaller particle.

Composite FIG. 11D is a TEM of the particles. Composite FIG. 11E shows the same particles as in Composite FIG. 11D mapped for the element cerium. Composite FIG. 11F shows the same particles as in Composite FIG. 11D mapped for the element titanium. Composite FIGS. 11E and 11F show that cerium occupies predominantly the core of the particles whereas titanium predominantly occupies the shell structure of the particles. However, some small amounts of titanium appear in the core of the particles and some small amounts of cerium appear in the shell.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed is:

1. A method of forming agglomerates comprising:
combusting an organic solvent soluble cerium compound dissolved in an organic solvent and a titanium (IV) chelate dissolved in an organic solvent in a combustion supporting gas to form agglomerates comprising two or more substantially spherical ceria/titania particles; and collecting the agglomerates.

2. The method according to claim 1 wherein the organic solvent soluble cerium compound comprises cerium propionate.

3. The method according to claim 1 wherein the titanium (IV) chelate is selected from the group consisting of titanium (IV) triethanolaminato isopropoxide, titanium acetyl acetone complexes and mixtures of the foregoing.

4. The method according to claim 1 wherein the organic solvent comprises methanol.

5. The method according to claim 1 wherein the combustion supporting gas comprises oxygen.

6. The method according to claim 1 wherein the organic solvent is one or more selected from the group consisting of methanol, ethanol, ethyl lactate, ethyl propionate, methyl lactate, n-propyl lactate, butyl lactate and 2 ethylhexyl lactate.

7. The method according to claim 1 wherein the two or more substantially spherical composite ceria/titania particles each have an average diameter ($D_{mean}$) within the range of from about 20 nm to about 1 μm.

8. The method of claim 1, wherein the organic solvent soluble cerium compound is selected from the group consisting of a cerium carboxylate and a cerium alkoxide.

9. The method of claim 1, wherein the organic solvent soluble cerium compound is selected from cerium carboxylates having from about 2 to about 5 carbon atoms.

10. The method according to claim 1 wherein the organic solvent soluble cerium compound comprises cerium propionate, the titanium (IV) chelate comprises triethanolamine titanate chelate, and the organic solvent is one or more selected from the group consisting of methanol, ethanol, ethyl lactate, ethyl propionate, methyl lactate, n-propyl lactate, butyl lactate and 2 ethylhexyl lactate.

11. The method according to claim 10 wherein the combustion supporting gas comprises oxygen.

12. A method of forming agglomerates comprising:
combusting a cerium compound and a titanium (IV) chelate dissolved in an organic solvent in a combustion supporting gas to form agglomerates comprising two or more substantially spherical ceria/titania particles; and, collecting the agglomerates, wherein the two or more substantially spherical composite ceria/titania particles each comprise:
a substantially crystalline core portion comprising $Ce_{(1-x)}Ti_{(x)}O_2$, where x is <0.25;
and
a substantially amorphous cladding covering at least a portion of the substantially crystalline core portion, the substantially amorphous cladding comprising $Ti_{(1-x)}Ce_{(y)}O_2$, where y is ≦0.50.

13. A method of forming agglomerates comprising:
combusting a cerium compound and a titanium (IV) chelate dissolved in an organic solvent in a combustion supporting gas to form agglomerates comprising two or more substantially spherical ceria/titania particles; and, collecting the agglomerates, wherein the substantially amorphous cladding entirely substantially covers the substantially crystalline core portion of each of the two or more substantially spherical composite ceria/titania particles.

* * * * *